(12) United States Patent
Kim (10) Patent No.: US 8,031,294 B2
(45) Date of Patent: Oct. 4, 2011

(54) LIQUID CRYSTAL DISPLAY MODULE

(75) Inventor: Sung-Woo Kim, Gyeongsangbuk-do (KR)

(73) Assignee: LG Display Co., Ltd., Seoul (KR)

(*) Notice: Subject to any disclaimer, the term of this patent is extended or adjusted under 35 U.S.C. 154(b) by 344 days.

(21) Appl. No.: 12/314,916

(22) Filed: Dec. 18, 2008

(65) Prior Publication Data

US 2010/0007814 A1 Jan. 14, 2010

(30) Foreign Application Priority Data

Jul. 9, 2008 (KR) .................. 10-2008-0066400

(51) Int. Cl.
*G02F 1/1335* (2006.01)
*F21V 7/04* (2006.01)
(52) U.S. Cl. ............... 349/65; 349/58; 349/61; 362/612
(58) Field of Classification Search .............. 349/58, 349/61, 65; 362/612
See application file for complete search history.

(56) References Cited

U.S. PATENT DOCUMENTS

2007/0019419 A1* 1/2007 Hafuka et al. ............... 362/373
2007/0247870 A1* 10/2007 Sakai et al. .................. 362/612
* cited by examiner

*Primary Examiner* — Nathanael R Briggs
(74) *Attorney, Agent, or Firm* — Morgan, Lewis & Bockius LLP

(57) ABSTRACT

A liquid crystal display module, includes: a light guide plate having a side surface, a rear surface and a top surface opposite to the rear surface; a reflective sheet having a front side on the rear surface of the light guide plate for reflecting light into the light guide plate and also having a rear side opposite to the front side; a lead connected to a light emitting diode lamp adjacent to the light guide plate; and a bottom frame surrounding the side surface of the light guide plate and covering edges of a rear surface of the light guide plate such that a center of the rear side of the reflective sheet is exposed in an opening of the bottom frame, wherein the lead passes through the opening in the bottom frame such that an end of the lead is disposed outside of the bottom frame.

16 Claims, 6 Drawing Sheets

LIQUID CRYSTAL DISPLAY MODULE

The present invention claims the benefit of Korean Patent Application No. 10-2008-0066400 filed in Korea on Jul. 9, 2008, which is hereby incorporated by reference in its entirety.

BACKGROUND OF THE INVENTION

1. Field of the Invention

The invention relates to a liquid crystal display (LCD) device, and more particularly, to a liquid crystal display module (LCDM) having a simple structure.

2. Discussion of the Related Art

The liquid crystal display module (LCDM) is widely used as a display device for a notebook personal computer (NTPC). The LCDM includes a liquid crystal panel and a driving circuit unit for driving the liquid crystal panel. The liquid crystal panel includes a first substrate and a second substrate and a layer liquid crystal material interposed therebetween. The liquid crystal material is divided into cells arranged in a matrix. Switching elements for controlling signals applied to the liquid crystal cells are formed on one of the first and second substrates.

The liquid crystal panel does not have a light source therein. Thus, the LCDM requires a light source that projects light into the liquid crystal panel. The light source for the LCDM can be a backlight unit that includes a lamp.

Figure 1:
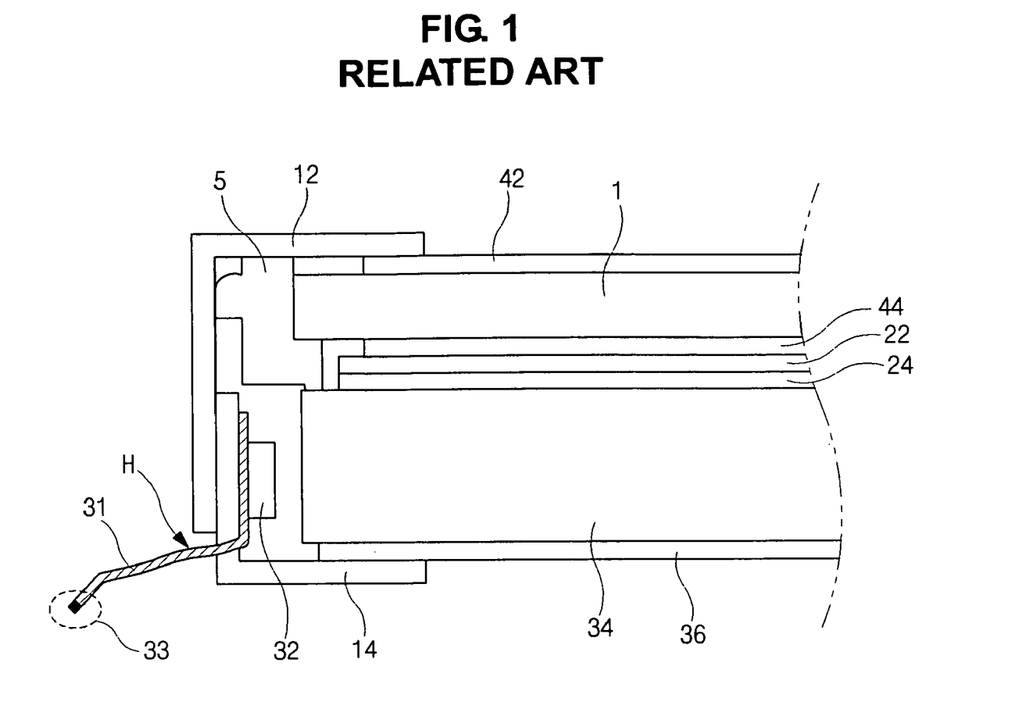
FIG. 1 is a cross-sectional view of the related art LCDM.

FIG. 1 is a cross-sectional view of the related art LCDM. As shown in FIG. 1, the LCDM includes a liquid crystal panel 1, a main frame 5, a top frame 12, and a bottom frame 14. The liquid crystal panel 1 includes first and second substrates (not shown) facing each other with a layer of liquid crystal material (not shown) therebetween. First and second polarization plates 42 and 44 are attached onto outer surfaces of the first and second substrates, respectively. A switching element, such as a thin film transistor (TFT), is formed on the first substrate. The top frame 12 covers edges of the liquid crystal panel 1 and sides of the main frame 5 such that the top frame 12 can support and protect the edges of the liquid crystal panel 1 and the sides of the main frame 5. The main frame 5 is combined with the top frame 12 by an affixing element, such as a screw.

Generally, the main frame 5 is fabricated using a mold. However, to provide television or monitor with high brightness, the main frame 5 is formed of a metallic material, such as aluminum (Al), having an excellent heat resistant property. The liquid crystal panel 1 is disposed on the main frame 5. The bottom frame 14 covers back edges of the main frame 5, so that the bottom frame 14 is combined with the main frame 5, the top frame 12 and a backlight unit to form a module.

A backlight unit of the LCDM includes a light emitting diode (LED) lamp 32 as a light source, a light guide plate 34 that disperses the dot light source of the LED lamp 32 into planar light, a reflective sheet 36 disposed under the light guide plate 34 and an optical sheet, including a prism sheet 24 and a diffusion sheet 22, stacked on the light guide plate 34. The LED lamp 32 is disposed at a side of the light guide plate 34. The light from the LED lamp 32 is projected into the side of the light guide plate 34 and reflected by the reflective sheet 36 to be changed into planar light. Then, the planar light is projected into the liquid crystal panel 1. The backlight unit may further include a lamp housing (not shown) surrounding the LED lamp 32 to increase a light efficiency. The lamp housing is formed of a material having a high optical reflectance.

The light guide plate 34 having a predetermined thickness includes an inclined rear surface and a flat front surface. The reflective sheet 36 reflects the light provided thereon from the rear surface of the light guide plate 34 back into the light guide plate 34 such that light projects from the front surface. As a result, light loss is reduced due to the reflective sheet 36.

Figure 2:
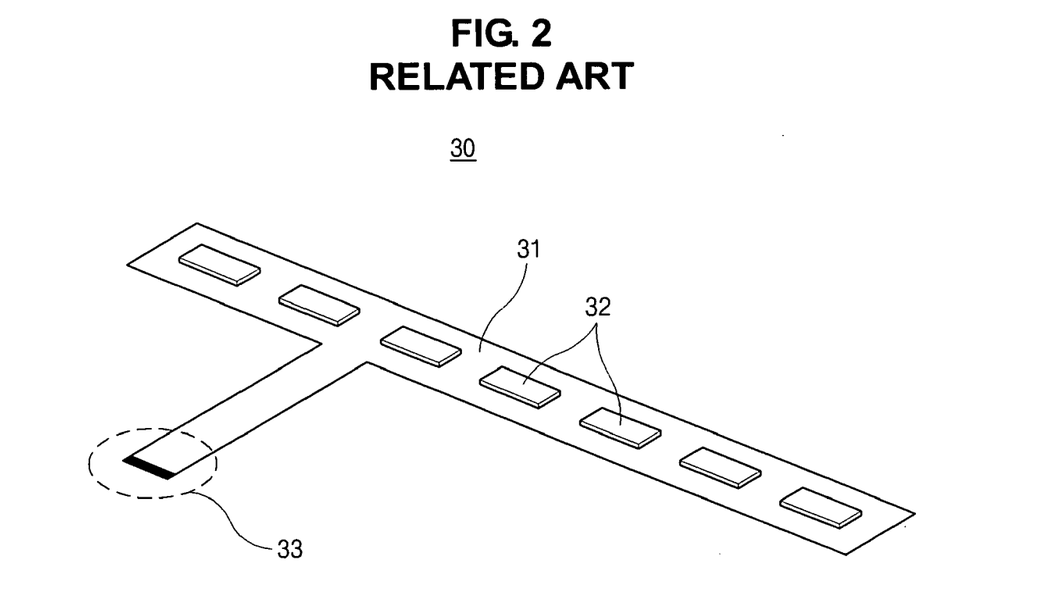
FIG. 2 is a perspective view of the related art LED lamp array.
Figure 3:
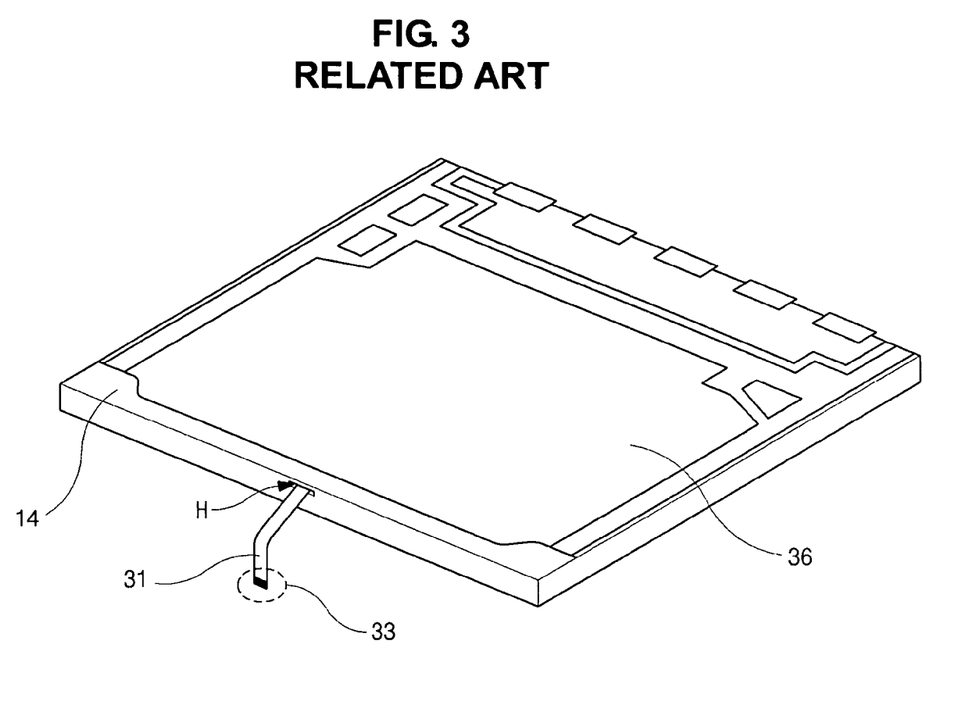
FIG. 3 is a perspective view showing a rear side of the related art LCDM.

FIG. 2 is a perspective view of the related art LED lamp array. FIG. 3 is a perspective view showing a rear side of the related art LCDM. Referring to FIGS. 2 and 3 with FIG. 1, a plurality of LED lamps 32 are arranged on a flexible printed circuit board (FPCB) 31. The FPCB 31 with the LED lamps can be referred to as the LED lamp array 30. The FPCB 31 is located on an inner side surface of the bottom frame 14 and extends onto an outer side by passing through a hole H in the side surface of the bottom frame 14. An exterior circuit connection part 33 is formed at an end of the FPCB 31. More specifically, the exterior circuit connection part 33 passes through the hole H and is connected to an exterior circuit connection part 33, such as a backlight unit controlling circuit (not shown), for applying control signal or operating power to the LEDs 32.

Unfortunately, when a position of the exterior circuit connection part 33 in the LED lamp array 30 is changed, a position of the hole H also has to be changed. However, since changes to the mold for fabricating the bottom frame 14 is required for changes in the position of the exterior circuit connection part 33, production costs increase. Moreover, production time increases when such changes are implemented.

SUMMARY OF THE INVENTION

Accordingly, embodiments of the invention are directed to an LCDM that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and-broadly described, a liquid crystal display module, includes: a light guide plate having a side surface, a rear surface and a top surface opposite to the rear surface; a reflective sheet having a front side on the rear surface of the light guide plate for reflecting light into the light guide plate and also having a rear side opposite to the front side; a lead connected to a light emitting diode lamp adjacent to the light guide plate; and a bottom frame surrounding the side surface of the light guide plate and covering edges of a rear surface of the light guide plate such that a center of the rear side of the reflective sheet is exposed in an opening of the bottom frame, wherein the lead passes through the opening in the bottom frame such that an end of the lead is disposed outside of the bottom frame.

In another aspect, a liquid crystal display module includes: a liquid crystal panel; a main frame surrounding the liquid crystal panel; a top frame covering the liquid crystal panel and the main frame; a light guide plate having a side surface, a rear surface and a top surface opposite to the rear surface; a bottom frame covering the main frame; and a lead connected to a light emitting diode lamp that is adjacent to the bottom frame, wherein the lead passes between the light guide plate and the bottom frame such that the lead is disposed outside of the bottom frame.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principle of the invention. In the drawings:

FIG. 5 is a perspective view showing a rear side of the LCDM shown in FIG. 4a.

DETAILED DESCRIPTION OF EXEMPLARY EMBODIMENTS

Reference will now be made in detail to exemplary embodiments of the invention, which are illustrated in the accompanying drawings. Like element numbers in the figures denote similar elements amongst the embodiments.

Figure 4A:
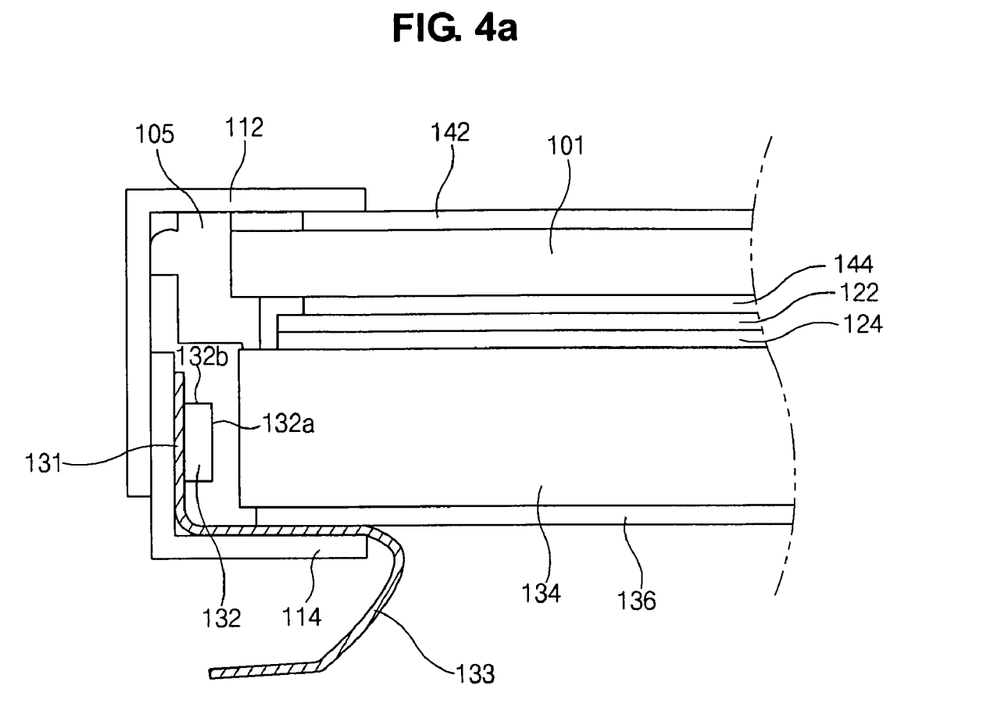
FIG. 4a is a cross-sectional view of an LCDM according to an embodiment of the invention having a flexible lead integrated with the flexible printed circuit board on which a top emitting diode is mounted.
Figure 4B:
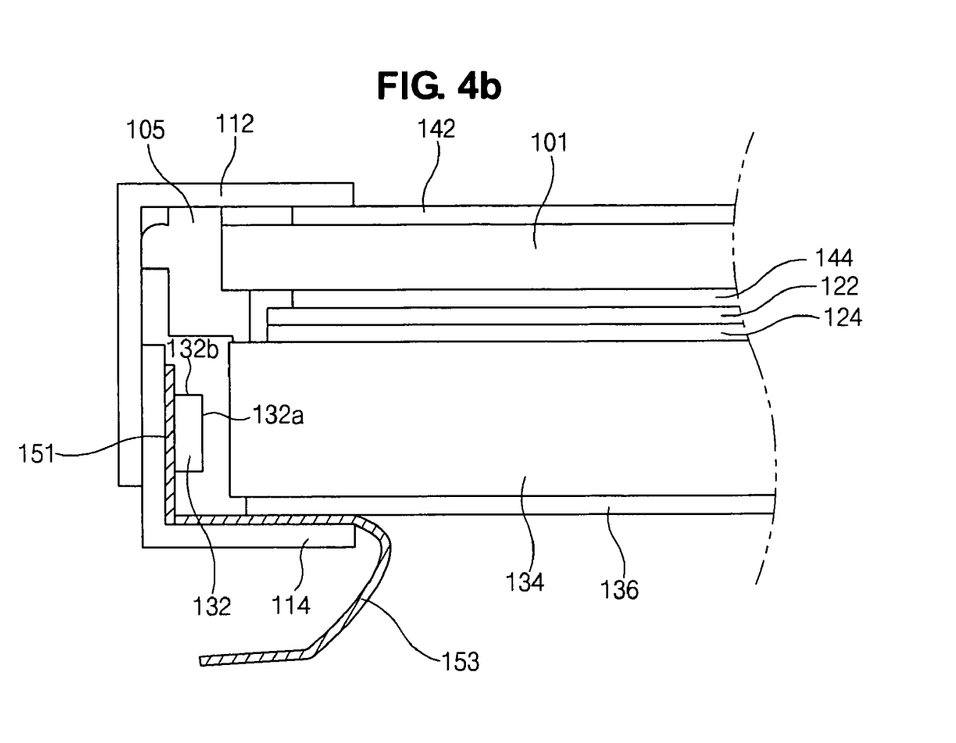
FIG. 4b is a cross-sectional view of an LCDM according to an embodiment of the invention having a lead contacting the flexible printed circuit board on which a top emitting diode is mounted.

FIG. 4a is a cross-sectional view of an LCDM according to an embodiment of the invention having a flexible lead integrated with the flexible printed circuit board on which a top emitting diode is mounted. FIG. 4b is a cross-sectional view of an LCDM according to an embodiment of the invention having a lead contacting the flexible printed circuit board on which a top emitting diode is mounted. As shown in FIG. 4a, an LCDM includes a liquid crystal panel 101, a main frame 105, a top frame 112, and a bottom frame 114. The liquid crystal panel 101 includes first and second substrates (not shown) facing each other with a liquid crystal material (not shown) therebetween. First and second polarization plates 142 and 144 are attached onto outer surfaces of the first and second substrates, respectively. A switching element, such as a thin film transistor (TFT), is formed on the first substrate.

The main frame 105 surrounds sides of the liquid crystal panel 101. The top frame 112 covers edges of the liquid crystal panel 101 and sides of the main frame 105 such that the top frame 112 can support and protect the edges of the liquid crystal panel 101 and sides of the main frame 105. The main frame 105 is combined with the top frame 112 by an affixing element, such as a screw.

The main frame 105 is fabricated using a mold. To meet requirements for high brightness, the main frame 105 is formed of a metallic material, such as aluminum (Al), having an excellent heat resistant property. The liquid crystal panel 101 is disposed on the main frame 105. The bottom frame 114 covers back edges of the main frame 105 so that the bottom frame 114 can be combined with the main frame 105, the top frame 112 and a backlight unit into a module.

A backlight unit of the LCDM is disposed under the liquid crystal panel 101 and includes a light emitting diode (LED) lamp 132 as a light source, a light guide plate 134 that disperses the dot light source of the LED lamp 132 into a planar light source, a reflective sheet 136 disposed under the light guide plate 134 and an optical sheet, including a prism sheet 124 and a diffusion sheet 122, stacked on the light guide plate 134. The LED lamp 132 is disposed at a side of the light guide plate 134. The light from the LED lamp 132 is projected into the side of the light guide plate 134 and reflected by the reflective sheet 136 to be changed into planar light. Then, the planar light is projected into the liquid crystal panel 10. The backlight unit may further include a lamp housing (not shown) surrounding the LED lamp 132 to increase a light efficiency. The lamp housing is formed of a material having a high optical reflectance.

The light guide plate 134 having a predetermined thickness includes an inclined rear surface and a flat front surface. The reflective sheet 136 reflects the light provided thereon from the rear surface of the light guide plate 134 back into the light guide plate 134 such that light projects from the front surface. As a result, light loss is reduced due to the reflective sheet 136.

The LED lamp 132 is disposed at the one end of the FPCB 131 such that the light emitted from the LED lamp 132 is provided directly into the light guide plate 134. The LED lamp 132 includes first and second surfaces 132a and 132b. The first surface 132a is substantially parallel to a side surface of the bottom frame 114 and has a first width, and the second surface 132b is substantially perpendicular to the side surface of the bottom frame 14 and the first surface 132a and has a second width smaller than the first width. Thus, the LED lamp 132 is mounted on a surface of the bottom frame 114 that is parallel to the side surface 134a of the light guide plate 134. The light is emitted through the first surface 132b of the LED lamp 132. Such an LED lamp 132 can also be referred to as a top emitting type LED.

An exterior circuit connection lead 133 is connected to the FPCB 131. More particularly, the exterior circuit connection lead 133 FPCB 131 passes through the space between the light guide plate 134 and the bottom frame. Accordingly, the exterior circuit connection lead 133 can be connected to an external circuit, such as a backlight unit controlling circuit (not shown), for applying a control signal and operating power.

FIG. 4a shows the exterior circuit connection lead 133 and the FPCB 131 as one integrated body, the exterior circuit connection lead 133 can be a separate element from the FPCB 131. As shown in FIG. 4b, the FPCB 151 contacts the exterior circuit connection lead 153, which only provides wiring between the FPCB 131 and the external circuit.

Figure 5:
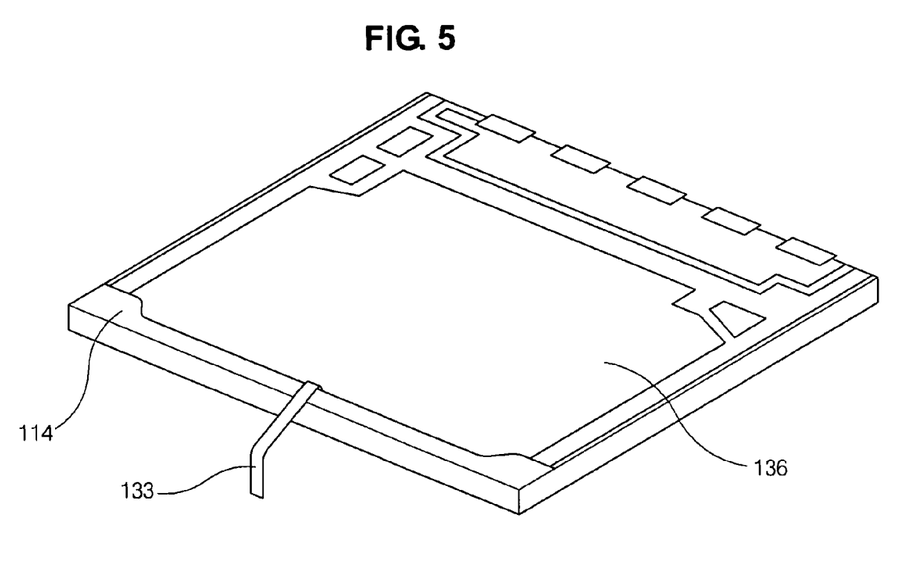

FIG. 5 is a perspective view showing a rear side of the LCDM shown in FIG. 4a. Referring to FIG. 5, a flexible printed circuit board (FPCB) 131, on which a plurality of LED lamps 132 are arranged, extends from an inner side of the bottom frame 114 outside of the bottom frame 114 by passing through a space between the light guide plate 134 and the bottom frame 114. The FPCB 131, where the LED 132 lamps are arranged, may be referred to as an LED lamp array. The bottom frame 114 surrounds a side surface of the light guide plate 134 and covers edges of a rear side of the light guide plate 134 such that a center of the rear side of the reflective sheet 136 is exposed. There is space between the light guide plate 134 and the bottom frame 114 at boundaries of the light guide plate 134 and the bottom frame 114. One end of the FPCB 131 is located on an inner side surface of the bottom frame 114, and the other end of the FPCB 131 passes through the space between the light guide plate 134 and the bottom frame 114. More particularly, the FPCB 131 passes through the space between the light guide plate 134 and the bottom frame 114.

When the reflective sheet 136 is disposed between the bottom frame 114 and the light guide plate 134, the space, where the other end of the FPCB 131 passes, is disposed between the bottom frame 114 and the reflective sheet 136. Since the FPCB 131 has a relatively small thickness, there is no increase in a total thickness of the LCDM due to the above structure.

Figure 6A:
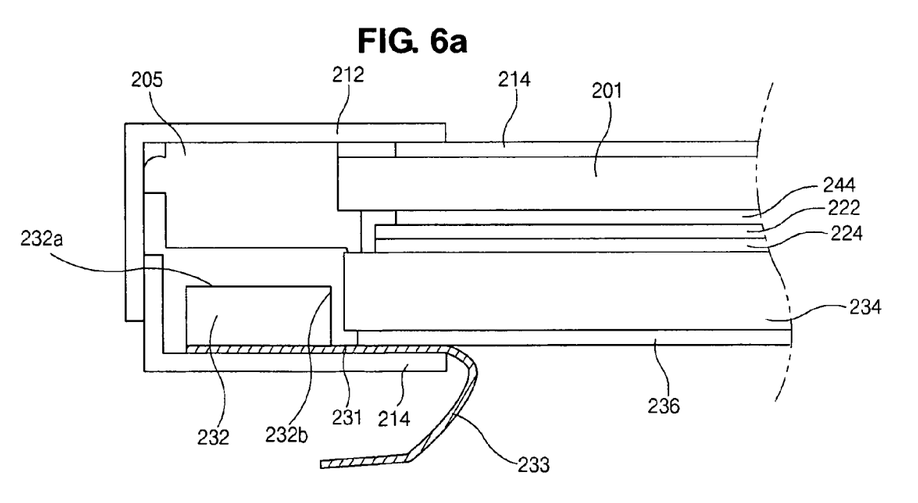
FIG. 6a is a cross-sectional view of an LCDM according to an embodiment of the invention having a flexible lead integrated with the flexible printed circuit board on which a side emitting diode is mounted.
Figure 6B:
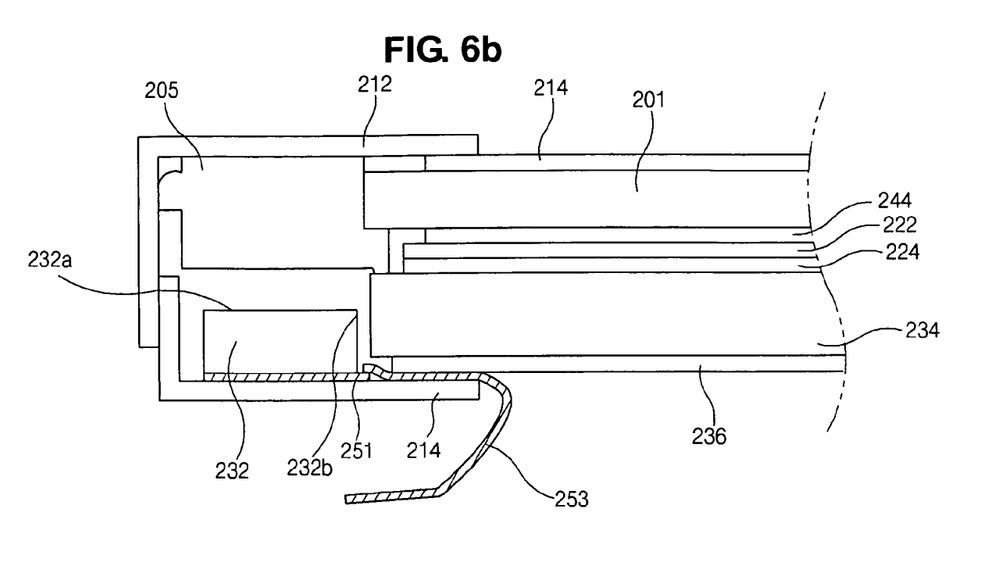
FIG. 6b is a cross-sectional view of an LCDM according to an embodiment of the invention having a lead contacting the flexible printed circuit board on which a side emitting diode is mounted.

FIG. 6a is a cross-sectional view of an LCDM according to an embodiment of the invention having a flexible lead integrated with the flexible printed circuit board on which a side emitting diode is mounted. FIG. 6b is a cross-sectional view of an LCDM according to an embodiment of the invention having a lead contacting the flexible printed circuit board on which a side emitting diode is mounted. As shown in FIG. 6a, an LCDM includes a liquid crystal panel 201, a main frame 205, a top frame 212, and a bottom frame 214. The liquid crystal panel 201 includes first and second substrates (not shown) facing each other and a layer of liquid crystal material (not shown) therebetween. First and second polarization plates 242 and 244 are attached onto outer surfaces of the first and second substrates, respectively. A switching element, such as a thin film transistor (TFT), is formed on the first substrate.

The main frame 205 surrounds sides of the liquid crystal panel 201. The top frame 212 covers edges of the liquid crystal panel 201 and sides of the main frame 205 such that the top frame 212 can support and protect of the edges of the liquid crystal panel 201 and sides of the main frame 205. The main frame 205 is combined with the top frame 212 by an affixing element, such as a screw.

The main frame 205 is fabricated using a mold. To meet the requirement for a high brightness, the main frame 205 is formed of a metallic material, such as aluminum (Al), having an excellent heat resistance property. The liquid crystal panel 201 is disposed on the main frame 205. The bottom frame 214 covers back edges of the main frame 205, so the bottom frame 214 is combined with the main frame 205, the top frame 212 and a backlight unit into a module.

A backlight unit of the LCDM is disposed under the liquid crystal panel 201 and includes a light emitting diode (LED) lamp 232 as a light source, a light guide plate 234 that disperses the dot light source from the LED lamp 232 into a planar light source, a reflective sheet 236 disposed under the light guide plate 234 and an optical sheet, including a prism sheet 224 and a diffusion sheet 222, stacked on the light guide plate 234. The LED lamp 232 is disposed at a side of the light guide plate 234. The backlight unit may further include a lamp housing (not shown) surrounding the LED lamp 232 to increase a light efficiency. The lamp housing is formed of a material having a high optical reflectance.

The light from the LED lamp 232 is projected into the side of the light guide plate 234 and reflected by the reflective sheet 236 to be changed into planar light. Then, the planar light is projected into the liquid crystal panel 201. The light guide plate 234 having a predetermined thickness includes an inclined rear surface and a flat front surface. The reflective sheet 236 reflects the light provided thereon from the rear surface of the light guide plate 234 back into the light guide plate 234 such that light projects from the front surface. As a result, light loss is reduced due to the reflective sheet 236.

A flexible printed circuit board (FPCB) 231, on which a plurality of LED lamps 232 are arranged, extends from an inner side of the bottom frame 214 outside of the bottom frame 214 by passing through a space between the light guide plate 234 and the bottom frame 214. The FPCB 231, where the LED lamps 232 are arranged, may be referred to as an LED lamp array. The bottom frame 214 surrounds a side surface of the light guide plate 234 and covers edges of a rear side of the light guide plate 234 such that a center of the rear side of the reflective sheet 236 is exposed. There is a space between the light guide plate 234 and the bottom frame 214 at boundaries of the light guide plate 234 and the bottom frame 214. One end of the FPCB 231 is located on an inner bottom surface of the bottom frame 214, and the other end of the FPCB 231 passes through the space between the light guide plate 234 and the bottom frame 214. More particularly, the FPCB 231 passes through the space between the light guide plate 234 and the bottom frame 214.

The LED lamp 232 is disposed at one end of the FPCB 231 such that the light emitted from the LED lamp 232 is provided directly into the light guide plate 234. The LED lamp 232 includes first and second surfaces 232a and 232b. The first surface 232a is substantially parallel to the bottom surface of the bottom frame 214 and has a first width, and the second surface 232b is substantially perpendicular to the bottom surface of the bottom frame 214 and the first surface 232a and has a second width smaller than the first width. Thus, the LED lamp 232 is mounted on a surface of the bottom frame 214 that is perpendicular to the side surface 234a of the light guide plate 234. The light is emitted through the second surface 232b of the LED lamp 232. Such an LED lamp 232 can be referred to as a side emitting type.

An exterior circuit connection lead 233 is formed at the other end of the FPCB 231. The FPCB 231 is connected to an exterior circuit connection lead 233, such as a backlight unit controlling circuit (not shown), for applying a control signal and an operating power.

FIG. 6a shows the exterior circuit connection lead 233 and the FPCB 231 as one integrated body, the exterior circuit connection lead 233 can be a separate element from the FPCB 231. As shown in FIG. 6b, the FPCB 251 contacts the exterior circuit connection lead 153, which only provides wiring between the FPCB 231 and the external circuit.

When the reflective sheet 236 is disposed between the bottom frame 214 and the light guide plate 234, the space, where the other end of the FPCB 231 (or the exterior circuit connection lead 233) passes, is disposed between the bottom frame 214 and the reflective sheet 236. Since the FPCB 231 has a relatively small thickness, there is no increase in an overall total thickness of the LCDM due to the above structure.

Since the FPCB (or the exterior circuit connection part) passes inside of the bottom frame through a space between the bottom frame and the reflective sheet (or the light guide plate) out of the bottom frame, the LCDM according to embodiments of invention do not require a hole in the bottom frame through which the FPCB passes, as shown in FIG. 2. Accordingly, the fabricating process for the bottom frame is simplified and there is no limitation on the position with respect to the bottom frame of where the FPCB comes out of the bottom frame. Moreover, since there is no hole in the bottom frame of the LCDM according to embodiments of the invention, problems resulting from particles entering through such a hole and light loss by such a hole are prevented. In addition, since a process of inserting an end of the FPCB into a hole at the bottom frame is no longer necessary, the assembling process of the LCDM in embodiments of the invention is simplified. It will be apparent to those skilled in the art that various modifications and variations can be made in the exemplary embodiments of the invention without departing from the spirit or scope of the invention. Thus, it is intended that the invention cover the modifications and variations of this invention provided they come within the scope of the appended claims and their equivalents.

What is claimed is:

1. A liquid crystal display module, comprising:
a light guide plate having a side surface, a rear surface and a top surface opposite to the rear surface;
a reflective sheet having a front side on the rear surface of the light guide plate for reflecting light into the light guide plate and also having a rear side opposite to the front side;
a lead connected to a light emitting diode lamp that is adjacent to the light guide plate; and
a bottom frame surrounding the side surface of the light guide plate and covering edges of a rear surface of the light guide plate such that a center of the rear side of the reflective sheet is exposed in an opening of the bottom frame,
wherein the lead passes through a space between the reflective sheet and the bottom frame into the opening in the bottom frame such that an end of the lead is disposed outside of the bottom frame, and wherein the light emitting diode lamp is at the side surface of the light guide plate, and the lead contacts both the reflective sheet and the bottom frame in the space.

2. The liquid crystal display module according to claim 1, further comprising a flexible printed circuit board on which the light emitting diode lamp is mounted, wherein the lead is an integral part of a flexible printed circuit board.

3. The liquid crystal display module according to claim 1, further comprising a flexible printed circuit board on which the light emitting diode lamp is mounted, wherein the lead contacts the flexible printed circuit board.

4. The liquid crystal display module according to claim 1, wherein the lead passes between the light guide plate and the bottom frame into the opening.

5. The liquid crystal display module according to claim 4, wherein the lead passes between the reflective sheet and the bottom frame into the opening.

6. The liquid crystal display module according to claim 1, wherein the light emitting diode lamp is mounted on a surface of the bottom frame that is parallel to the side surface of the light guide plate.

7. The liquid crystal display module according to claim 1, wherein the light emitting diode lamp is mounted on a surface of the bottom frame that is perpendicular to the side surface of the light guide plate.

8. The liquid crystal display module according to claim 1, further comprising an external circuit for applying a control signal to the light emitting diode lamp.

9. The liquid crystal display module according to claim 1, further comprising a lamp housing having reflective properties that surrounds the light emitting diode lamp.

10. A liquid crystal display module, comprising:
a liquid crystal panel;
a main frame surrounding the liquid crystal panel;
a top frame covering the liquid crystal panel and the main frame;
a light guide plate having a side surface, a rear surface and a top surface opposite to the rear surface;
a reflective sheet disposed at the rear surface of the light guide plate;
a bottom frame covering the main frame; and
a lead connected to a light emitting diode lamp that is adjacent to the bottom frame,
wherein the lead passes through a space between the reflective sheet and the bottom frame such that the lead is disposed outside of the bottom frame, and wherein the light emitting diode lamp is at the side surface of the light guide plate, and wherein the lead contacts both the reflective sheet and the bottom frame in the space.

11. The liquid crystal display module according to claim 10, further comprising a flexible printed circuit board on which the light emitting diode lamp is mounted, wherein the lead is an integral part of a flexible printed circuit board.

12. The liquid crystal display module according to claim 10, further comprising a flexible printed circuit board on which the light emitting diode lamp is mounted, wherein the lead contacts the flexible printed circuit board.

13. The liquid crystal display module according to claim 10, wherein the light emitting diode lamp is mounted on a surface of the bottom frame that is parallel to the side surface of the light guide plate.

14. The liquid crystal display module according to claim 10, wherein the light emitting diode lamp is mounted on a side of the bottom frame that is perpendicular to the side surface of the light guide plate.

15. The liquid crystal display module according to claim 10, further comprising an external circuit for applying a control signal to the light emitting diode lamp.

16. The liquid crystal display module according to claim 10, further comprising a lamp housing having reflective properties that surrounds the light emitting diode lamp.

* * * * *